(12) United States Patent
Jeong

(10) Patent No.: US 7,208,873 B2
(45) Date of Patent: Apr. 24, 2007

(54) ORGANIC ELECTROLUMINESCENCE DISPLAY DEVICE AND METHOD FOR FABRICATING THE SAME

(75) Inventor: Seung-Jae Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 19 days.

(21) Appl. No.: 11/083,214

(22) Filed: Mar. 18, 2005

(65) Prior Publication Data

US 2006/0125407 A1    Jun. 15, 2006

(30) Foreign Application Priority Data

Dec. 10, 2004    (KR) ...................... 10-2004-0104509

(51) Int. Cl.
*H01J 1/62* (2006.01)
(52) U.S. Cl. ...................... 313/512; 313/506; 313/509
(58) Field of Classification Search ............... 313/512, 313/506, 509, 504, 505; 315/169.3, 169.4
See application file for complete search history.

(56) References Cited

U.S. PATENT DOCUMENTS

2006/0145605 A1*   7/2006   Park ........................... 313/506

\* cited by examiner

*Primary Examiner*—Tuyet Thi Vo
(74) *Attorney, Agent, or Firm*—Robert E. Bushnell, Esq.

(57) ABSTRACT

The present invention relates to an organic electroluminescence display device capable of reducing the width of wiring without a voltage drop by contacting the lower lines and the upper lines with a contact member such as a solder ball, conductive paste or ACF in a sealing process, thereby forming a double structure of common power supply bus lines and/or cathode bus lines after, when forming source/drain electrodes of thin film transistors, forming lower lines of common power supply bus lines and/or cathode bus lines formed on a peripheral part of the organic electroluminescence display device and forming upper lines at positions on an encapsulating substrate corresponding to the lower lines, and a method for fabricating the organic electroluminescence display device.

28 Claims, 9 Drawing Sheets

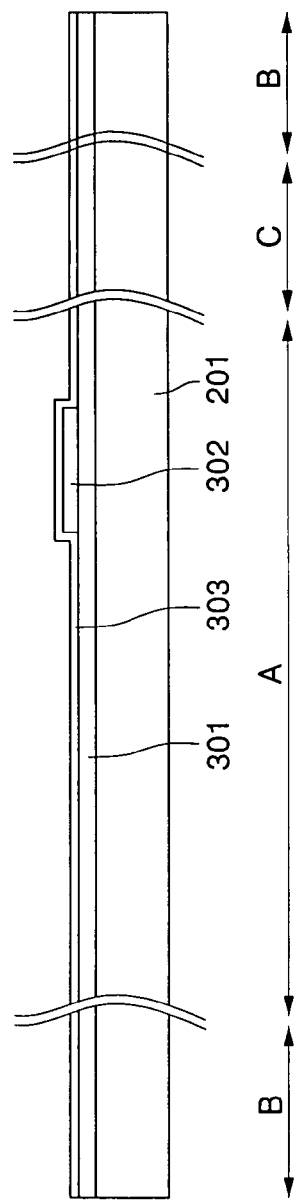
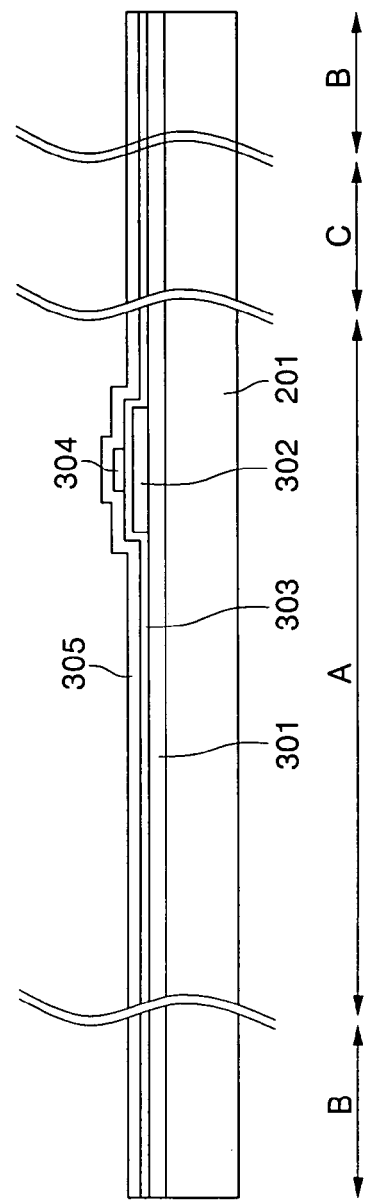

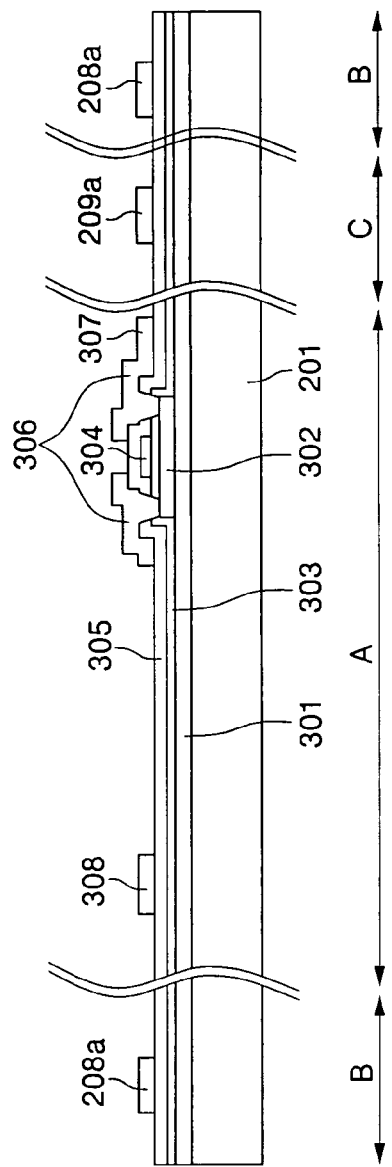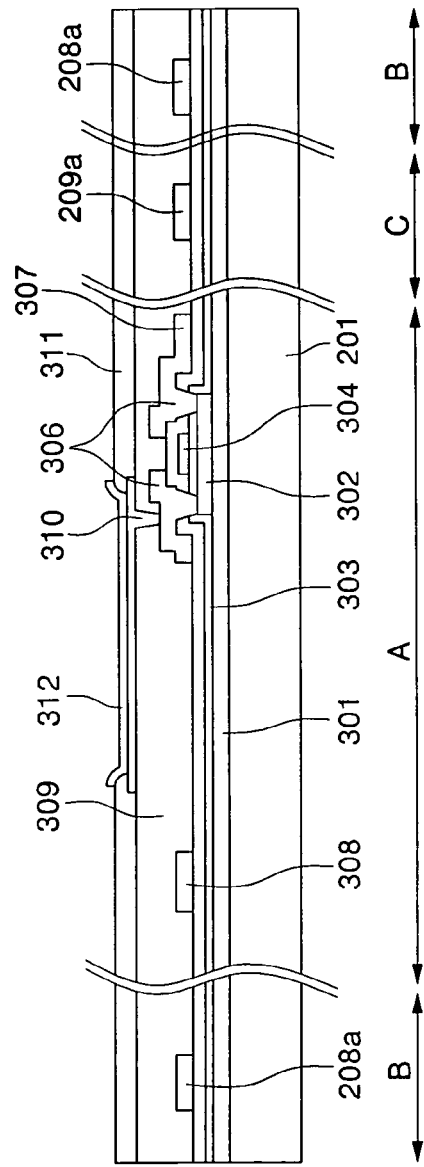

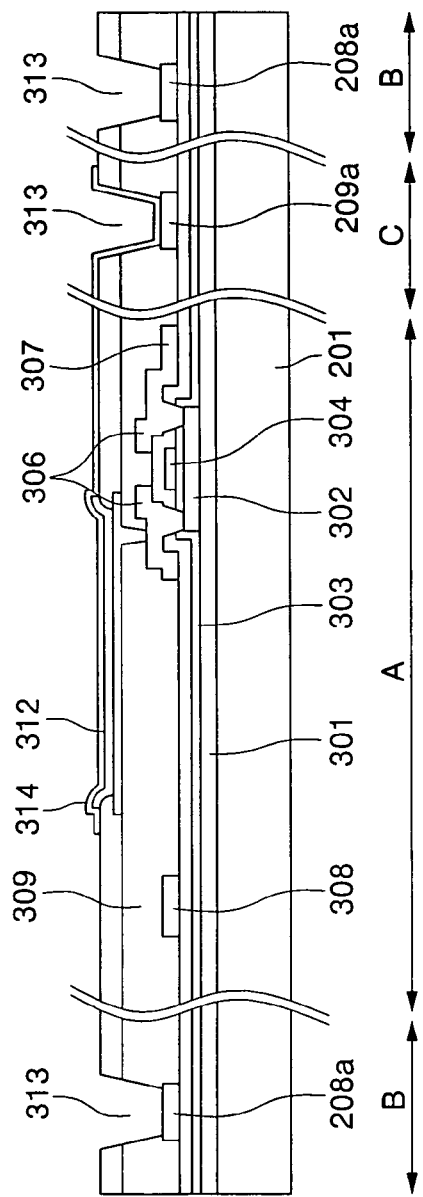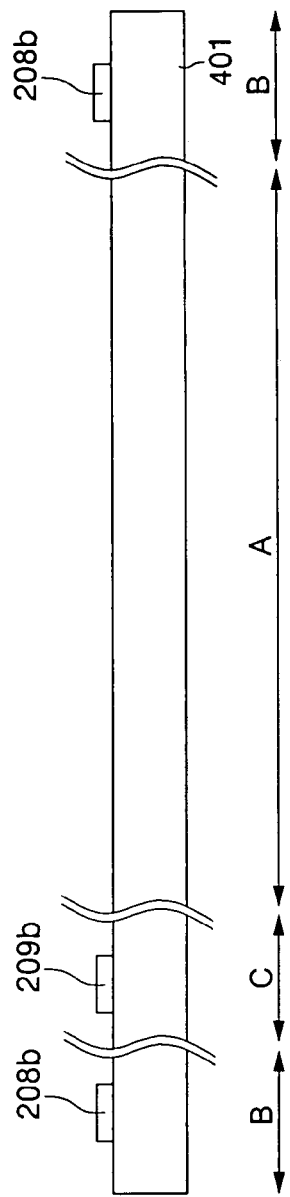

ORGANIC ELECTROLUMINESCENCE DISPLAY DEVICE AND METHOD FOR FABRICATING THE SAME

CLAIM OF PRIORITY

This application claims the benefit of Korean Patent Application No. 2004-104509, filed on Dec. 10, 2004, the disclosure of which is hereby incorporated herein by reference in its entirety.

BACK GROUND OF THE INVENTION

1. Field of the Invention

The present invention relates to an organic electroluminescence display device and a method for fabricating the same, more particularly, to an organic electroluminescence display device in which lower lines of common power supply bus lines and/or cathode bus lines on a device substrate are contacted with upper lines of the common power supply bus lines and/or the cathode bus lines on an encapsulating substrate through a contact member, and a method for fabricating the same.

2. Description of Related Art

Recently, flat panel displays including a liquid crystal display, an organic electroluminescence display device and a plasma display panel capable of solving the problems of heavy weight and bulkiness that are demerits of a conventional display device such as a cathode ray tube are being watched.

The organic electroluminescence display device has excellent viewing angle and contrast since it is a self-light emitting element. It is possible to fabricate a light weight thin type organic electroluminescence display device. The organic electroluminescence display device is also beneficial in terms of power consumption since a back light is not required. On the other hand, the liquid crystal display has a limit in brightness, contrast, viewing angle and scaling-up since it is not a self-emitting device, but a light receiving element. The plasma display panel has problems that it has heavy weight, high power consumption and complicated fabrication method compared with other flat panel displays although it is a self-light emitting element.

Furthermore, the organic electroluminescence display device has merits of strong resistance against an external impact, a wide application temperature range, a simple fabrication method and an inexpensive fabrication cost since it is possible to drive the organic electroluminescence display device by low voltage direct current (DC), it has fast response speed, and it is solid.

However, an organic electroluminescence display device according to the prior art has demerits that area of the light emitting part cannot be increased since the common power supply bus line and the cathode bus line are formed in such a manner that they have wide width.

SUMMARY OF THE INVENTION

Therefore, in order to solve the foregoing demerits and problems of the prior art, it is an object of the present invention to provide an organic electroluminescence display device.

It is another object of the present invention to provide a method of manufacturing the organic electroluminescence display device.

It is further an object of the present invention to provide an organic electroluminescence display device in which lower lines of common power supply bus lines and/or cathode bus lines on a device substrate are contacted with upper lines of the common power supply bus lines and/or the cathode bus lines on an encapsulating substrate through a contact member, and a method for fabricating the same.

The foregoing object of the present invention is achieved by an organic electroluminescence display device comprising a device substrate; a light emitting part comprising a first electrode formed on the device substrate, an organic layer including at least an organic light emitting layer, and a second electrode; a peripheral part having a first lower power supply line formed to provide the light emitting part with voltage of a first level and a first upper power supply line corresponding to the first lower power supply line, said first upper power supply line contacted with the first lower power supply line through a contact member; and an encapsulating substrate on which said first upper power supply line formed, said encapsulating substrate positioned on the device substrate to encapsulate organic electroluminescence display device.

Furthermore, the foregoing object of the present invention is achieved by an organic electroluminescence display device in which the first lower supply power line and the first upper power supply line are common power supply bus lines or cathode bus lines.

Furthermore, the foregoing object of the present invention is achieved by an organic electroluminescence display device further comprising a second lower power supply line and a second upper power supply line for supplying voltage of a second level to the light emitting part, wherein said second lower power supply line is formed on the device substrate, and the second upper power supply line is formed on the encapsulating substrate.

Furthermore, the foregoing object of the present invention is achieved by an organic electroluminescence display device in which the second lower power supply line and the second upper power supply line are contacted with each other through the contact member, and the second lower power supply line and the second upper power supply line are common power supply bus lines or cathode bus lines.

Furthermore, the foregoing object of the present invention is achieved by a method for fabricating an organic electroluminescence display device comprising the steps of preparing a device substrate and an encapsulating substrate; forming a semiconductor layer, a gate insulating layer, a gate electrode, a scan line and an interlayer dielectric layer; forming a contact hole for exposing a part of the semiconductor layer by etching a prescribed region of the interlayer dielectric layer; forming source/drain electrode materials on the whole surface of the device substrate; forming source/drain electrodes, a data line, a first lower power supply line and a second lower power supply line by patterning the source/drain electrode materials; forming an insulating layer on the whole surface of the device substrate; forming a first electrode on the insulating layer; forming a pixel defining layer and forming a via-hole for exposing the first lower power supply line and the second lower power supply line by patterning the pixel defining layer material after forming a pixel defining layer material on the whole surface of the device substrate; forming an organic layer including at least an organic light emitting layer, and a second electrode on the device substrate; forming a moisture absorbing material on the encapsulating substrate; forming a second upper power supply line and a first upper power supply line at respective positions on the encapsulating substrate corresponding to the first lower power supply line and the second lower power supply line formed on the device substrate; forming a contact member in a viahole of the device substrate; and sealing the device substrate by the encapsulating substrate in such a manner that the first lower power supply line, the first upper power supply line, the second lower power supply line and the second upper power supply line are contacted with the device substrate by the contact member.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein:

FIG. 3A to FIG. 3E are cross-sectional views of a process of forming a device substrate for an organic electroluminescence device according to one preferred embodiment of the present invention;

FIG. 4A to FIG. 4C are cross-sectional views of a process of forming an encapsulating substrate for an organic electroluminescence device according to one preferred embodiment of the present invention.

DETAILED DESCRIPTION OF THE PREFERRED EMBODIMENTS

Figure 1A:
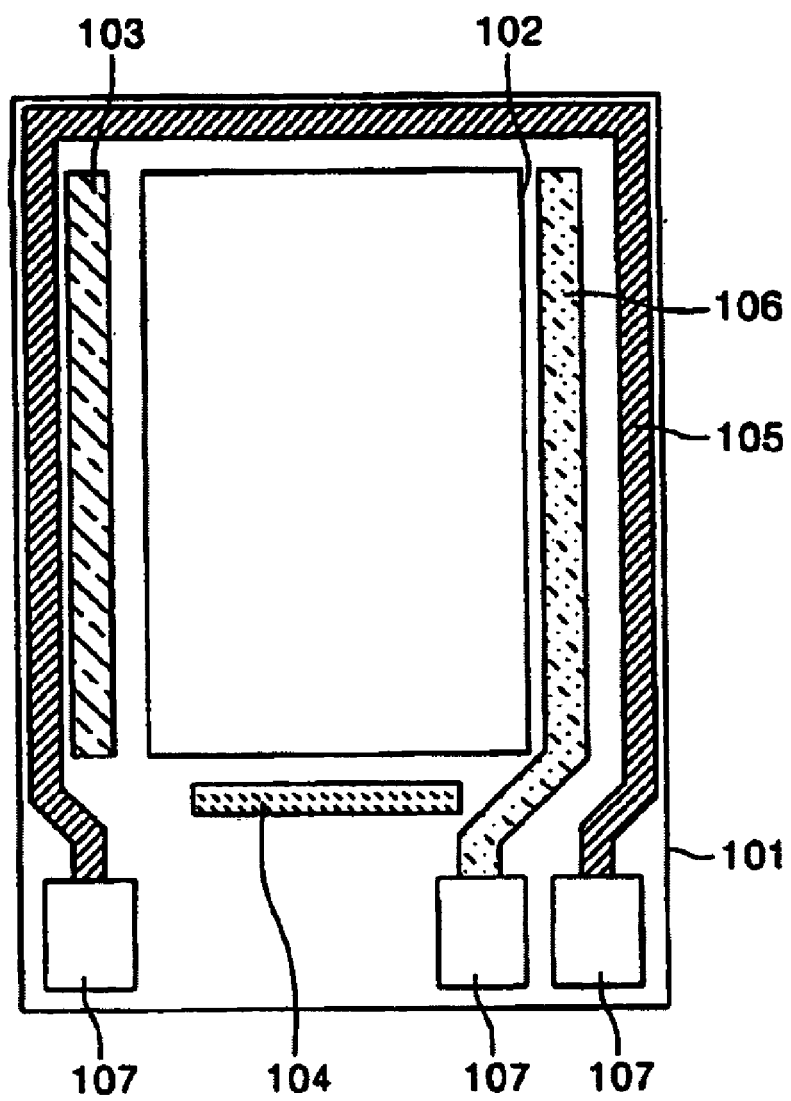
FIG. 1A and FIG. 1B are plane figures of an organic electroluminescence display device formed by the prior art.

The present invention will now be described in detail in connection with preferred embodiments with reference to the accompanying drawings, wherein length of layers and regions, thickness, etc. can be exaggeratingly presented for convenience of understanding. For reference, like reference characters designate corresponding parts throughout several views.

Figure 1B:
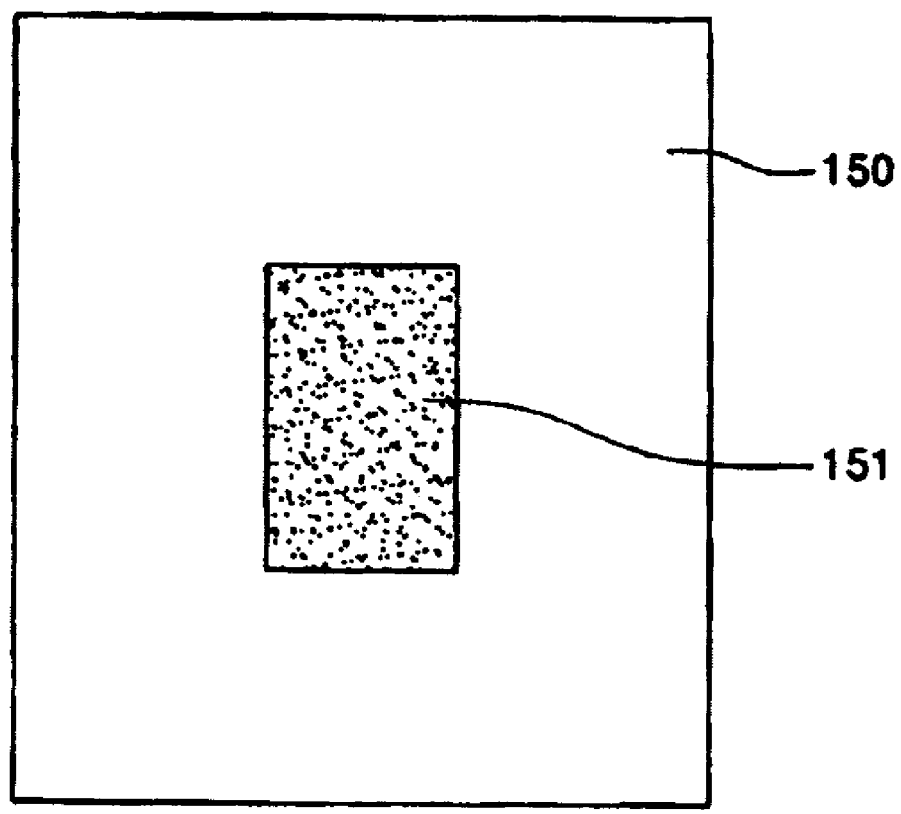

FIG. 1A and FIG. 1B are plane figures of an organic electroluminescence display device formed by the conventional art.

Referring to FIG. 1A, a light emitting part 102 having unit pixels comprises a first electrode, an organic layer including at least organic light emitting layer and a second electrode. The light emitting part is positioned on a device substrate 101, and a scan driver 103 and a data driver 104 for transmitting an electrical signal to the unit pixels and a common power supply bus line 105 and a cathode bus line 106 for supplying a power source are positioned on the outside of the light emitting part 102. Pads 107 for contacting the respective common power supply bus line 105 and cathode bus line 106 with an outer unit are formed under the light emitting part 102.

Generally, the common power supply bus line 105 and the cathode bus line 106 are formed of a metal wiring having wide width to supply a sufficient power source to the unit pixels of the light emitting part 102 without a problem such as a voltage drop.

Referring to FIG. 1B, a moisture absorbing material 151 is formed on a prescribed region of an encapsulating substrate 150, wherein other elements except the moisture absorbing material 151 are not formed on the surface of the encapsulating substrate 150.

An organic electroluminescence display device is completed by sealing the device substrate of FIG. 1A and the encapsulating substrate of FIG. 1B.

However, the above organic electroluminescence display device has demerits that area of the light emitting part cannot be increased since the common power supply bus line and the cathode bus line are formed in such a manner that they have wide width.

Figure 2A:
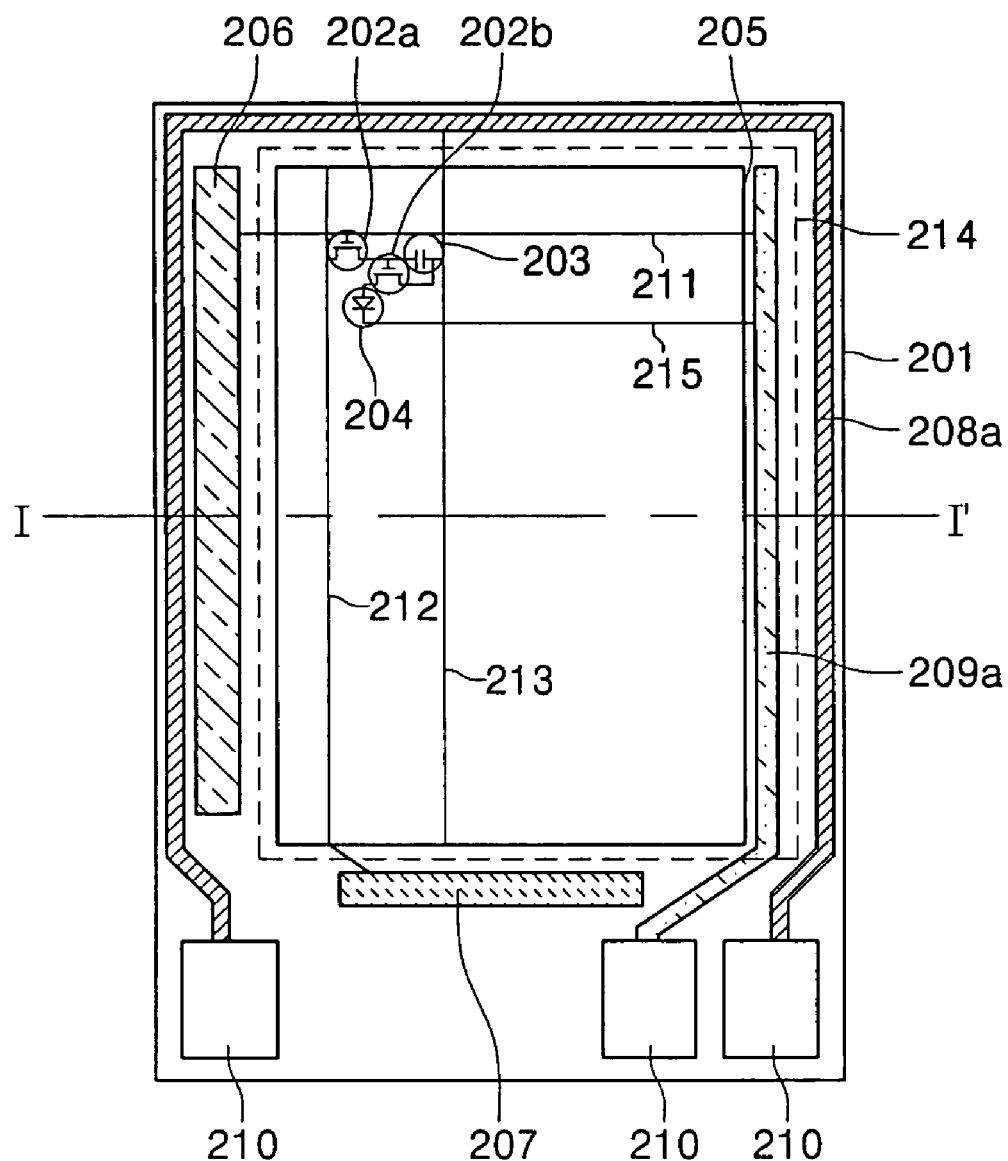
FIG. 2A and FIG. 2B are plane figures of an organic electroluminescence display device formed by the present invention.
Figure 2B:
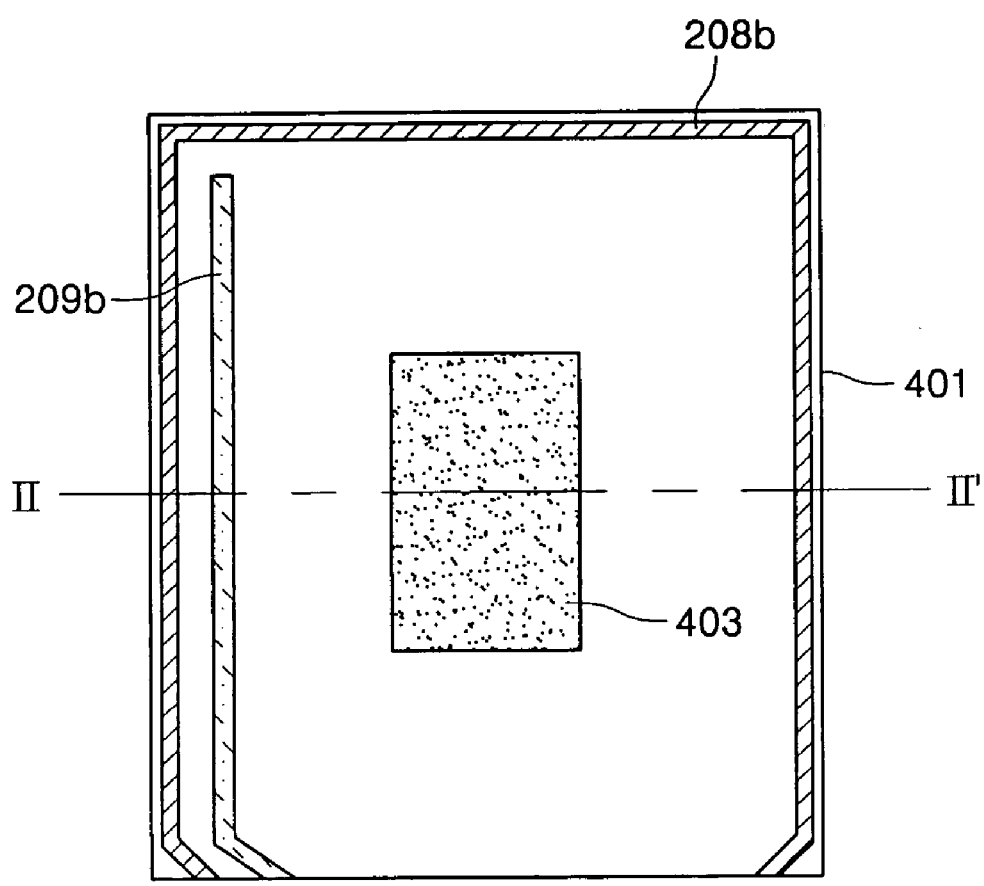

FIG. 2A and FIG. 2B are plane figures of an organic electroluminescence display device formed by the present invention.

Referring to FIG. 2A, a plurality of unit pixels comprises switching or driving thin film transistors 202a, 202b for controlling pixels, a capacitor 203 for storing an electric charge, a first electrode, an organic electroluminescence diode 204 which is comprised of an organic layer comprising at least an organic light emitting layer and a second electrode. A light emitting part 205 in which the plurality of unit pixels is positioned at a central part of the device substrate 201 are arranged on a device substrate 201 such as a glass or plastic substrate. A scan driver 206, a data driver 207, a first lower power supply line 208a and a second lower power supply line 209a for supplying an electrical signal or power supply to the unit pixels are positioned on the outside of the light emitting part 205.

And, pads 210 for connecting the first lower power supply line 208a and the second lower power supply line 209a with an outer unit are connected to an end of the first lower power supply line 208a and the second lower power supply line 209a.

The first lower power supply line 208a and the second lower power supply line 209a can be lower lines of common power supply bus lines or lower lines of cathode bus lines.

In the light emitting part 205, a scan line 211 for transmitting signals inputted from the scan driver 206 to each unit pixel, a data line 212 for transmitting signals inputted from the data driver 207 to each unit pixel, and a common power supply line 213 for transmitting a common power source supplied from the first lower power supply line 208a to each unit pixel are repeatedly arranged. The second lower power supply line 209a is directly contacted with a second electrode 214 of the organic electroluminescence diode 204 that covers the whole light emitting part 205.

Referring to FIG. 2B, a moisture absorbing material 403 is positioned at a prescribed region on an encapsulating substrate 401 such as a glass or plastic substrate, that is, a region of the encapsulating substrate corresponding to the light emitting part 205. The first upper power supply line 208b and the second upper power supply line 209b are formed on the positions on the encapsulating substrate respectively corresponding to the first lower power supply line 208a and the second lower power supply line 209a of the device substrate 201. The first upper power supply line 208b and the second upper power supply line 209b can be upper lines of the common power supply bus lines or upper lines of the cathode bus lines.

Although it is not illustrated in FIG. 2A and FIG. 2B, the device substrate is sealed after forming a contact member on the first lower power supply line 208a and the second lower power supply line 209a of the device substrate 201, and aligning the device substrate 201 and the encapsulating substrate 401 in such a manner that the first lower power supply line 208a and the second lower power supply line 209a of the device substrate 201 correspond to the first upper power supply line 208b and the second upper power supply line 209b of the encapsulating substrate 401 respectively.

The first lower power supply line 208a and the first upper power supply line 208b are electrically contacted, and the second lower power supply line 209a and the second upper power supply line 209b are electrically contacted through the contact member formed of a solder ball, conductive paste or ACF (anisotropic conductive film).

In the present invention, the area of the light emitting part 205 can be increased without a voltage drop by forming first power supply lines 208a, 208b and/or second power supply lines 209a, 209b, thereby respectively forming a double structure of lower lines and upper lines differently from the prior art as illustrated in FIG. 1A and FIG. 1B, wherein the area of the light emitting part 205 increased by the present invention is the sum of an original area of a conventional single layer structure and a margin area generated by forming a double structure of the present invention so that the area of the light emitting part is proportional to increase of the margin area.

Although each one line out of the first power supply lines 208a, 208b and/or second power supply lines 209a, 209b is formed in FIG. 2A and FIG. 2B, two or more lines thereof can be formed to prevent a voltage drop.

Although it is illustrated in FIG. 2A and FIG. 2B that widths of the first power supply lines 208a, 208b and the second power supply lines 209a, 209b are decreased at the same time, either width of the first power supply lines 208a, 208b or the second power supply lines 209a, 209b may be decreased. It is more preferable that both widths of the first power supply lines 208a, 208b and the second power supply lines 209a, 209b are decreased to further increase area of the light emitting part 205.

FIG. 3A to FIG. 3E are cross-sectional views of a process of forming a device substrate for an organic electroluminescence device according to one preferred embodiment of the present invention.

Referring to FIG. 3A, a buffer layer 301 for preventing impurities such as ions or gases generated from the device substrate 201 from diffusing or/and penetrating into devices formed on an upper part of the device substrate is formed in a silicon oxide layer, silicon nitride layer or a plural layer thereof on a device substrate 201 such as a glass or plastic substrate by physical vapor deposition or chemical vapor deposition.

Subsequently, an amorphous silicon layer is formed on the buffer layer 301 to a prescribed length by chemical vapor deposition or physical vapor deposition. The amorphous silicon layer is dehydrogenated to remove gas such as hydrogen contained in the amorphous silicon layer. The dehydrogenated amorphous silicon layer is crystallized into a polycrystalline silicon layer by performing crystallization process on the dehydrogenated amorphous silicon layer, and patterning the polycrystalline silicon layer so that a semiconductor layer 302 is formed.

The crystallization process is performed by using one or more methods selected from a rapid thermal annealing method, a solid phase crystallization method, an excimer laser crystallization method, a metal induced crystallization method, a metal induced lateral crystallization method and a sequential lateral solidification method.

The semiconductor layer 302 is of thin film transistor formed on a pixel out of the plural unit pixels formed on the light emitting part 205, and FIG. 3A particularly shows a semiconductor layer of thin film transistor having the driving thin film transistor 202b illustrated in FIG. 2A. Although it is not illustrated, a remaining thin film transistor 202a may be simultaneously formed on the device substrate as well.

A gate insulating layer 303 is formed on the device substrate by using a silicon oxide layer, a silicon nitride layer or a plural layer thereof.

Referring to FIG. 3B, a gate electrode 304 is formed on a light emitting part region A by depositing a gate electrode material on the device substrate and patterning the gate electrode material. Furthermore, although it is not illustrated on the drawing, a scan line 211 can be formed at the same time by patterning the gate electrode material.

Although it is not illustrated in the drawing, a process of forming source/drain regions can be performed by implanting impurities into the semiconductor layer 302 by using the gate electrode 304 as a mask.

Next, an interlayer dielectric layer 305 is formed on the substrate by using a silicon oxide layer, a silicon nitride layer or plural layers thereof.

Referring to FIG. 3C, a contact hole for exposing a part of the semiconductor layer 302 is formed on the interlayer dielectric layer 305 by using a photoresist pattern.

Subsequently, source/drain electrodes 306 of the thin film transistor 202b, a common power supply line 307 and a data line 308 are formed on the light emitting part region A. A first lower power supply line 208a is formed on a first power supply line region B. A second upper power supply line 209a is formed on a second power supply region C by depositing source/drain electrode materials on the device substrate and patterning the source/drain electrode materials.

Referring to FIG. 3D, an insulating layer 309 such as a planarization layer is formed on the device substrate, wherein a passivation layer (not illustrated on the drawing) can be further formed on the device substrate before forming the planarization layer.

A first electrode 310 is formed after forming a via-hole for exposing a part of source/drain electrodes 306 by etching a part of the planarization layer of the light emitting part region A.

Next, a pixel defining layer 311 for exposing a prescribed region of the first electrode 310 is formed by forming an insulating layer on the device substrate and patterning the insulating layer, wherein in an etching process of forming the pixel defining layer 311, a process of forming a via-hole can be simultaneously performed to expose the second lower power supply line 209a of the second power supply line region C and the first lower power supply line 208a of the first power supply line region B.

Subsequently, an organic layer 312 including at least an organic light emitting layer is formed on the first electrode 310.

Referring to FIG. 3E, a via-hole 313 for exposing the first lower power supply line 208a and the second lower power supply line 209a is formed.

Next, second electrode material is formed on the device substrate, and the second electrode material is patterned so that second electrode 314 that covers at least the organic layer 312 of the light emitting part region A and is contacted with the second lower power supply line 209a is formed.

Figure 4B:
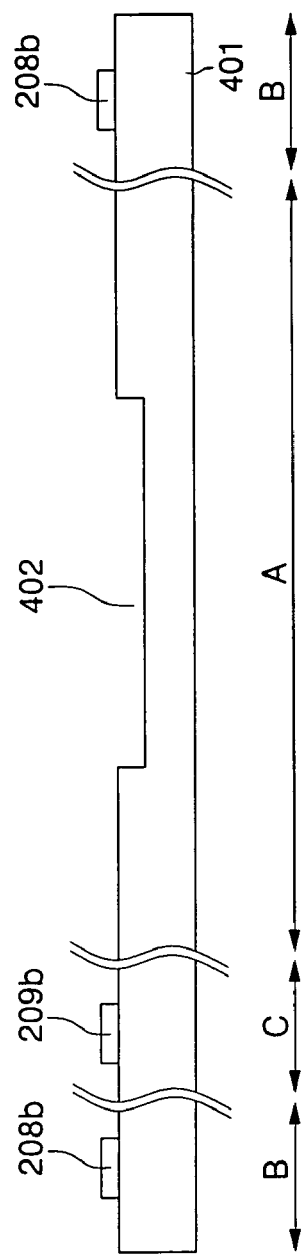
Figure 4C:
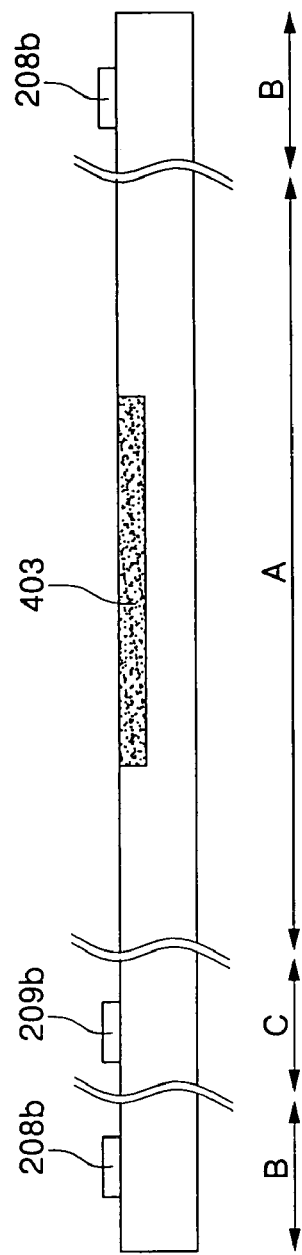

FIG. 4A to FIG. 4C are cross-sectional views of a process of forming an encapsulating substrate for an organic electroluminescence device according to one preferred embodiment of the present invention.

Referring to FIG. 4A, the first upper power supply line 208b is formed on the first power supply line region B, and the second upper power supply line 209b is formed on the second power supply line region C by depositing conductive materials (i.e., the same materials as the source/drain electrode materials of FIG. 3c) on an encapsulating substrate as a glass or plastic substrate and patterning the conductive materials, wherein the first upper power supply line 208b and the second upper power supply line 209b are respectively formed on positions on the encapsulating substrate corresponding to the first lower power supply line 208a and the second lower power supply line 209a of device substrate 201.

Referring to FIG. 4B, a groove 402 is formed on a position on the light emitting part region A corresponding to a light emitting part 205 of the device substrate 201.

Referring to FIG. 4C, an encapsulating substrate is completed by forming a moisture absorbing material 403 in the groove 402 formed on the light emitting part region A.

Figure 5:
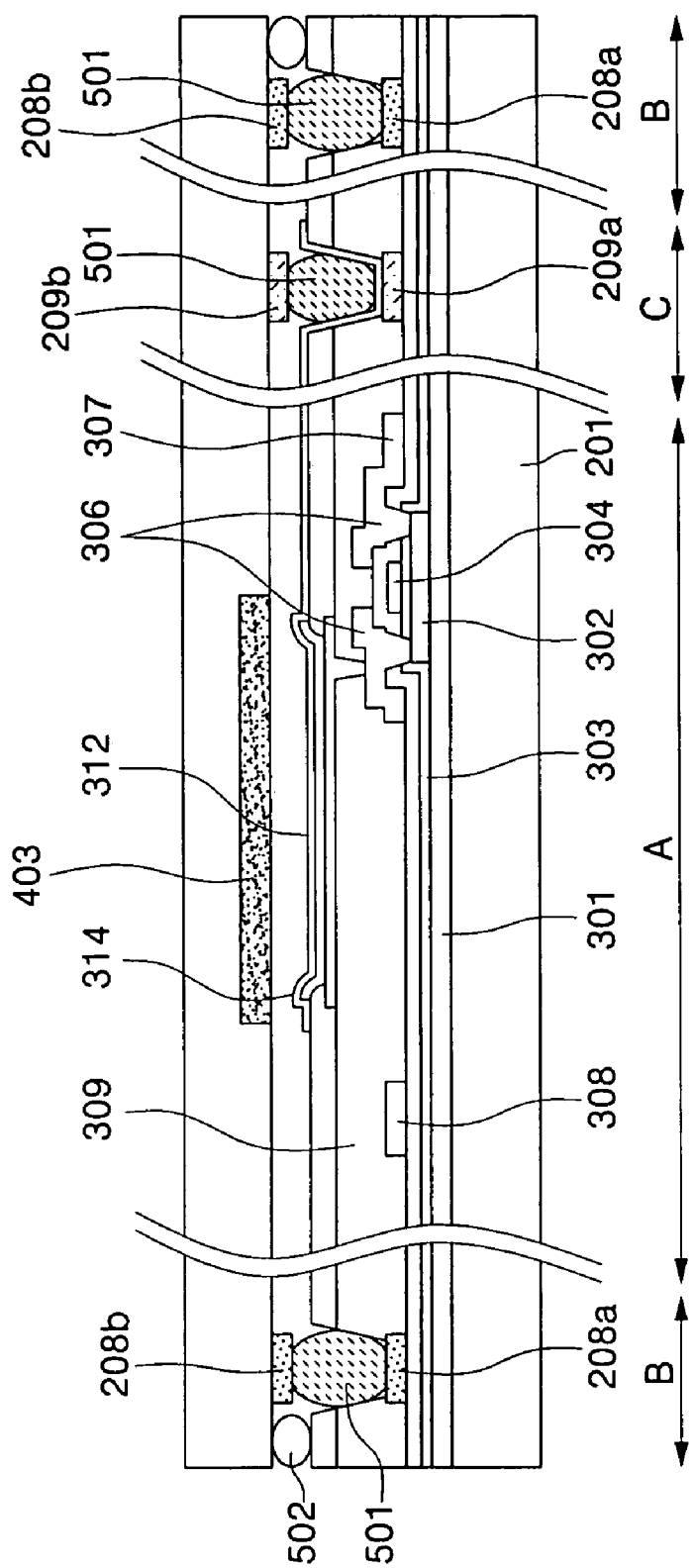
FIG. 5 is a cross-sectional view of an organic electroluminescence display device completed by one preferred embodiment of the present invention.

Referring to FIG. 5 showing a cross-sectional view of a process of completing an organic electroluminescence display device by sealing a device substrate described by referring to the FIG. 3A to FIG. 3E with an encapsulating substrate described by referring to FIG. 4A to FIG. 4C, a contact member 501 for electrically contacting the first lower power supply line 208a and the first upper power supply line 208b formed on the first power supply line region B with the second lower power supply line 209a and the second upper power supply line 209b formed on the second power supply line region C is formed before sealing the encapsulating substrate 401 onto the device substrate 201.

The contact member 501 is formed of a material such as solder ball, conductive paste and ACF (anisotropic conductive film) that has electrical conductivity and can be adhered to a device.

Subsequently, an organic electroluminescence display device is completed by sealing the device substrate 201 and the encapsulating substrate 401 using a sealant 502 after forming the contact member 501.

Therefore, the area of a light emitting part of an organic electroluminescence display device can be increased by forming the common power supply bus lines and the cathode bus lines without problems such as a voltage drop since the first power supply lines and the second power supply lines (i.e., common power supply bus lines and cathode bus lines) are formed in a double structure of lower lines and upper lines so that the same degree of electric charge can be conducted to the first power supply lines and the second power supply lines compared with a case of forming the first power supply lines and the second power supply lines in a conventional single layer.

The widths of the lower lines are decreased if widths of the upper lines are increased, and the light emitting part can be formed on a marginal area formed as the widths of the lower lines are being decreased so that the area of the light emitting part is increased in proportion to width decrease of the lower lines and width increase of the upper lines. Thus, the increase of the area of the light emitting part is related with respective widths of the lower lines and the upper lines of the first power supply lines and the second power supply lines.

Therefore, an organic electroluminescence display device and a method for fabricating the organic electroluminescence display device according to the present invention have an effect of increasing light emitting area of a light emitting part by forming common power supply bus lines or/and cathode bus lines in a double structure of lower lines and upper lines, thereby reducing a space occupied by wiring of a peripheral part.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic electroluminescence display device, comprising:
   a device substrate;
   a light emitting part comprising a first electrode formed on the device substrate, an organic layer including at least an organic light emitting layer, and a second electrode;
   a peripheral part having a first lower power supply line formed to provide the light emitting part with voltage of a first level, and a first upper power supply line corresponding to the first lower power supply line, said first upper power supply line contacted with the first lower power supply line through a contact member; and
   an encapsulating substrate on which said first upper power supply line formed, said encapsulating substrate positioned on the device substrate to encapsulate organic electroluminescence display device.

2. The organic electroluminescence display device according to claim 1, wherein the first lower supply power line and the first upper power supply line are common power supply bus lines or cathode bus lines.

3. The organic electroluminescence display device according to claim 2, wherein the common power supply bus lines are connected to source/drain electrodes of thin film transistors formed on a unit pixel inside the light emitting part, and the common power supply bus lines are connected to a common power supply line.

4. The organic electroluminescence display device according to claim 2, wherein the number of the common power supply bus lines is at least two.

5. The organic electroluminescence display device according to claim 2, wherein the cathode bus lines are connected to the organic layer formed on a unit pixel inside the light emitting part, and the cathode bus lines are connected to the second electrode.

6. The organic electroluminescence display device according to claim 2, wherein the number of the cathode bus lines is at least two.

7. The organic electroluminescence display device according to claim 2, wherein pads each are connected to an end of the common power supply bus lines and the cathode bus lines.

8. The organic electroluminescence display device according to claim 1, further comprising a second lower power supply line and a second upper power supply line for supplying voltage of a second level to the light emitting part, said second lower power supply line formed on the device substrate, the second upper power supply line formed on the encapsulating substrate.

9. The organic electroluminescence display device according to claim 8, wherein the second lower power supply line and the second upper power supply line are contacted with each other through the contact member, and the second lower power supply line and the second upper power supply line are common power supply bus lines or cathode bus lines.

10. The organic electroluminescence display device according to claim 9, wherein the common power supply bus lines are connected to source/drain electrodes of thin film transistors formed on a unit pixel inside the light emitting part, and the common power supply bus lines are connected to a common power supply line.

11. The organic electroluminescence display device according to claim 9, wherein the number of the common power supply bus lines is at least two.

12. The organic electroluminescence display device according to claim 9, wherein the cathode bus lines are connected to the organic layer formed on a unit pixel inside the light emitting part, and the cathode bus lines are connected to the second electrode.

13. The organic electroluminescence display device according to claim 9, wherein the number of the cathode bus lines is at least two.

14. The organic electroluminescence display device according to claim 9, wherein pads each are connected to an end of the common power supply bus lines and the cathode bus lines.

15. The organic electroluminescence display device according to claim 1, wherein the light emitting part further comprises at least two thin film transistors and one capacitor.

16. The organic electroluminescence display device according to claim 15, wherein the thin film transistors include a switching thin film transistor and a driving thin film transistor.

17. The organic electroluminescence display device according to claim 1, wherein the peripheral part is equipped with a scan driver and a data driver.

18. The organic electroluminescence display device according to claim 17, wherein the scan driver is connected to source/drain electrodes of thin film transistors formed on a unit pixel inside the light emitting part.

19. The organic electroluminescence display device according to claim 17, wherein the data driver is connected to a gate electrode of thin film transistors formed on a unit pixel inside the light emitting part.

20. The organic electroluminescence display device according to claim 1, further comprising a moisture absorbing material on the encapsulating substrate for protecting the light emitting part on the device substrate.

21. The organic electroluminescence display device according to claim 1, wherein the contact member is solder ball, conductive paste or anisotropic conductive film.

22. A method for fabricating an organic electroluminescence display device, comprising the steps of:
    preparing a device substrate and an encapsulating substrate;
    forming a semiconductor layer, a gate insulating layer, a gate electrode, a scan line and an interlayer dielectric layer;
    forming a contact hole for exposing a part of the semiconductor layer by etching a prescribed region of the interlayer dielectric layer;
    forming source/drain electrode materials on the device substrate;
    forming source/drain electrodes, a data line, a first lower power supply line and a second lower power supply line by patterning the source/drain electrode materials;
    forming an insulating layer on the device substrate;
    forming a first electrode on the insulating layer;
    forming a pixel defining layer and forming a first viahole and a second via-hole for exposing the first lower power supply line and the second lower power supply line, respectively, by patterning the pixel defining layer material after forming a pixel defining layer material the surface of the device substrate;
    forming an organic layer including at least an organic light emitting layer, and a second electrode on the device substrate;
    forming a moisture absorbing material on the encapsulating substrate;
    forming a second upper power supply line and a first upper power supply line at respective positions on the encapsulating substrate corresponding to the first lower power supply line and the second lower power supply line;
    forming a first contact member and a second contact member in the first via-hole and the second via-hole, respectively; and
    sealing the device substrate by the encapsulating substrate in such a manner that the first lower power supply line and the first upper power supply line contacted to each other via the first contact member, the second lower power supply line and the second upper power supply line are contacted to each other via the second contact member.

23. The method for fabricating an organic electroluminescence display device according to claim 22, wherein the step of forming the insulating layer is the step of forming an interlayer dielectric layer.

24. The method for fabricating an organic electroluminescence display device according to claim 22, wherein the step of forming the insulating layer is the step of forming a planarization layer.

25. The method for fabricating an organic electroluminescence display device according to claim 22, wherein the step of forming a first contact member and a second contact member is the step of filling the first via-hole and the second via-hole with solder balls.

26. The method for fabricating an organic electroluminescence display device according to claim 22, wherein the step of forming a first contact member and a second contact member is the step of filling the viahole of the device substrate with conductive paste or anisotropic conductive film.

27. The method for fabricating an organic electroluminescence display device according to claim 22, wherein the step of contacting the first lower power supply line and first upper power supply line with the device substrate by the first contact member is the step forming common power supply bus lines.

28. The method for fabricating an organic electroluminescence display device according to claim 22, wherein the step of contacting the second lower power supply line and second upper power supply line with the device substrate by the second contact member is the step of forming cathode bus lines.

* * * * *